United States Patent
Pantelakis et al.

[11] Patent Number: 6,049,501
[45] Date of Patent: Apr. 11, 2000

[54] MEMORY DATA BUS ARCHITECTURE AND METHOD OF CONFIGURING MULTI-WIDE WORD MEMORIES

[75] Inventors: Dimitris C. Pantelakis; Wai T. Lau, both of Austin, Tex.

[73] Assignee: Motorola, Inc., Schaumburg, Ill.

[21] Appl. No.: 09/210,827

[22] Filed: Dec. 14, 1998

[51] Int. Cl.$^7$ ..................................................... G11C 8/00
[52] U.S. Cl. ..................... 365/230.03; 365/207; 365/208
[58] Field of Search .............................. 365/230.03, 207, 365/208, 189.11; 327/214, 215

[56] References Cited

U.S. PATENT DOCUMENTS

| | | | |
|---|---|---|---|
| 5,555,215 | 9/1996 | Nakagome et al. | 365/226 |
| 5,821,792 | 10/1998 | Miwa | 327/215 |
| 5,825,709 | 10/1998 | Kobayashi | 365/230.03 |
| 5,835,437 | 11/1998 | Omachi | 365/230.03 |

*Primary Examiner*—Son T. Dinh
*Attorney, Agent, or Firm*—Keith E. Witek; Daniel D. Hill

[57] ABSTRACT

A memory device (50) contains a first array of memory (12) and a second array of memory (14). The arrays (12 and 14) are coupled to four segmented current data buses (iGDLs) (16, 18, 20, and 22). When in a x36 word mode of operation, the current data buses (16, 18, 20, and 22) are wired to communicate directly with output buffers (56–59) through several current-to-voltage converters (24–31). When in a x18 word mode of operation, the current data buses (16, 18, 20, and 22) are wired to communicate through the converts (24–31), through a voltage bus (52 and 54, see also FIG. 3), to the output buffers (56–59). The change in wiring for x36 word mode versus x18 word mode is done either by a top-level metal option in fabrication or by user software programming whereby the device (50) is easily wired into one of two configurations while maintaining an advantageous speed/power product.

21 Claims, 3 Drawing Sheets

MEMORY DATA BUS ARCHITECTURE AND METHOD OF CONFIGURING MULTI-WIDE WORD MEMORIES

FIELD OF THE INVENTION

The present invention relates generally to integrated circuit (IC) design and manufacture, and more particularly to, a high-speed configurable memory data bus architecture that supports two different output word sizes.

BACKGROUND OF THE INVENTION

The integrated circuit (IC) industry is faced with the challenge of providing memory products, such as static random access memory (SRAM), dynamic random access memory (DRAM), embedded DRAM, nonvolatile memory, floating gate memory, and like memory devices, with higher storage capacities while simultaneously reducing power consumption and improving access speeds. FIG. 1 illustrates a modern memory architecture 10 which is commonly used in conventional, high density, low power, high speed, low cost SRAM ICs. In FIG. 1, the entire memory capacity is generally split into two memory arrays 12 and 14. To obtain greater speed*power performance, the device of FIG. 1 uses current sensing techniques.

Unlike conventional SRAM memory circuits which use voltage sensing, modern SRAM memory devices are now utilizing current sensing whereby data read from the memory arrays 12 and 14 are provided with improved speed*power performance. Therefore, the memory cells in the arrays 12 and 14 transport current through the current global data bus 18 and 20 whereby the magnitude of the current through current global data bus lines will determine the logic value that is stored in each memory cell that is subject to the read operation. For example, if a positive differential current flow is detected by any of the sense amplifier circuits 24–31, that value will be read as a logic 1. In the same manner, if a negative differential current is detected by any one of the sense amplifier circuits 24–31, a logic 0 is output for that selected memory device. The current global data buses, 16, 18, 20, and 22 provide this positive or negative differential current to current-to-voltage converters 24–31 in FIG. 1. The converters 24–31 convert the current (I) from the current global data buses 16–22 to differential voltage (V) signals which are provided to output circuits/drivers 35–42 in FIG. 1.

While current sensing provides improved performance in memory devices, current sensing is a new technology used in static random access memories (SRAMs). Since current sensing in SRAMs is new, current sensing presents many new and different challenges to the IC industry. As an example, customers are now requesting that the current sensing memory configurations of FIG. 1 be provided in one of two selectable word-size configurations. Specifically, customers are asking that the device of FIG. 1, which is a x36 word size product, be provided in a x18 word size as well.

The FIG. 1 illustrates a device which is hard-wired to provide only 36-bit wide data through thirty-six output terminals located external to the integrated circuit (IC). In FIG. 1, nine bits are provided via a right half of the array 12, nine bits are provided via a left half of the array 12, nine bits are provided from the right half of the array 14, and a final nine bits (for a total of thirty-six bits) are provided from the left half of array 14 as shown. Some customers may want a x18 data word mode in FIG. 1 where the word size of the device 10 is halved from x36 bits to x18 bits. In this case, instead of reading in parallel from both arrays 12 and 14 to provide 36 bits, only one of the arrays 12 or 14 needs to be accessed at any one point in time whereby only 18 bits are provided per access to the lowest order bits of the data bus output terminals. The x18 mode requires some architectural modifications in FIG. 1 so that the 18 bits are provided to the correct low order IC pins regardless of which array (array 12 or 14) they are read from.

In the prior art, when using the conventional SRAM voltage sensing scheme, a designer could easily change between a x18 and x36 configuration by simply electrically shorting the bus 16 to the bus 18 and by electrically shorting the bus 20 to the bus 22 with a little added tri-state logic. However, when using the current sensing scheme in modern SRAMs, the electrical shorting of the buses 16 and 18 and the electrical shorting of the buses 20 and 22 is not feasible. If one were to short these buses together, parasitic resistance and capacitance on the bus would result in a severe degradation in the reliability and performance of the current sensed product. The added resistance and capacitance would make accurate and consistent sensing of the cell current nearly impossible during read operations of the arrays 12 and 14. Therefore, prior art methods of converting a first memory configuration to a second memory configuration by bus short circuiting are not feasible in the modern current sensed SRAM devices.

Another method that may be used to provide two products of different word sizes is to design two separate integrated circuits, one for the first memory configuration and yet another for the second integrated circuit configuration. The costs, maintenance, design, upkeep, testing, manufacture, and shipping of two completely different integrated circuits is not an attractive solution. Maintaining two integrated circuits would add extra cost to the design, consume valuable engineering resources that could be used elsewhere, reduced time to market, and involve other disadvantages. Generally, it would be better to design one product that could be easily configured into either a x18 mode or a x36 mode without designing two totally separate product lines.

Therefore, a need exists in the industry for a memory architecture, which uses current sensing capability, that can be configured in one of many different word size modes of operation while maintaining the efficient speed*power product of the current sensing solution.

BRIEF DESCRIPTION OF THE DRAWINGS

A better understanding of the present invention can be obtained when the following detailed description of a preferred embodiment is considered in conjunction with the following drawings, in which.

Figure 1:
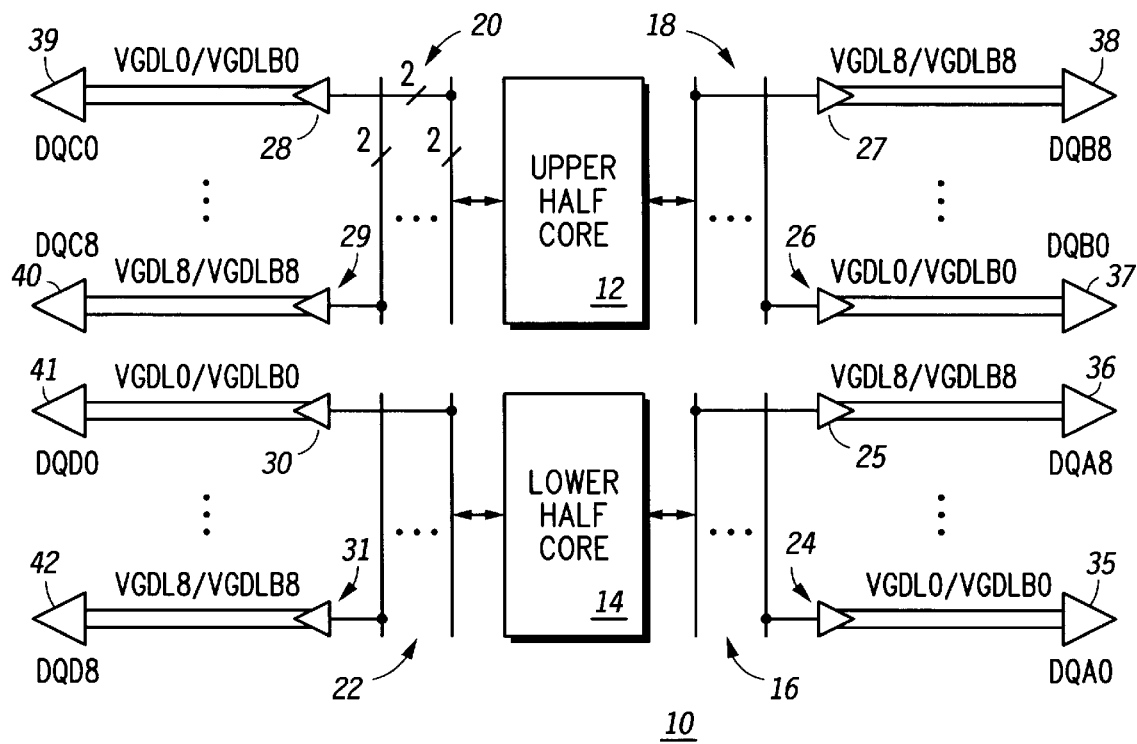
FIG. 1 illustrates, in block diagram form, a memory in accordance with the prior art.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

DESCRIPTION OF A PREFERRED EMBODIMENT

While several embodiments of the present invention will be described in detail below, the present invention, common to all embodiments, lies in a current sensed memory that is multiple word width configurable by using a current-to-voltage converter and voltage-mode global data line (vGDLs) pairs in conjunction with precharge and equalization circuits to avoid having excessively long current-mode global data lines (iGDLs). The use of this architecture has resulted in a significant improvement of the read time of a static random access memory (SRAM) memory, and provides reliable read data at a high speed.

The embodiments of the present invention will now be described in detail with reference to FIGS. 2–4.

Figure 2:
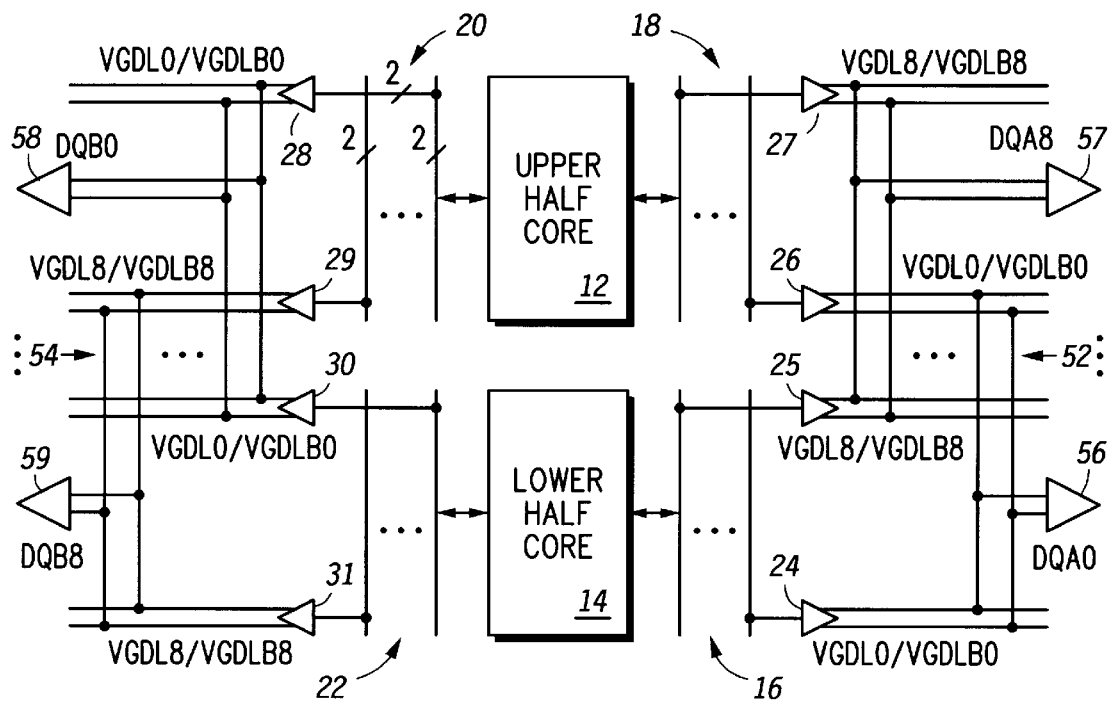
FIG. 2 illustrates, in block diagram form, a memory in accordance with the present invention.

FIG. 2 illustrates, in block diagram form, a memory 50 in accordance with the present invention. Note that for the purposes of simplicity and clarity, certain portions of memory 50 not necessary for describing the invention are not shown, such as for example, row and column decoding and the bit line sensing circuits. Memory 50 includes memory arrays or array halves 12 and 14, current-mode global data lines (iGDLs) 16, 18, 20, and 22, current sensing circuits 24–31, voltage-mode global data lines (vGDLs) 52 and 54, and input/output buffers 56–59. The lines 16, 18,20,22,52, and 54 may each also be referred to as buses herein. For purposes of illustration, memory 50 can be configured as a memory having a word width of x18 or a word width of x36. In other embodiments, other word widths can be used, such as x72, x36, x18, x128, x64, x16, x8, x4, or any combination of these widths.

Each of memory array halves 12 and 14 includes a plurality of blocks of conventional static random access memory (SRAM) cells arranged in a tiled row-column layout. Data is input and output on both the left and right sides of memory arrays 12 and 14, where half the data from the array 12 or 14 enters/exits from the right and the other half of the data from the array 12 or 14 enters/exits from the left. Bit line pairs (typically complementary and not specifically shown in FIG. 2) of memory array half 12 are coupled to the current mode global data lines 18 and 20, labeled "iGDL0/iGDLB0"–"iGDL8/iGDLB8" via conventional current mode sense amplifiers located within the arrays 12 and 14. Likewise, bit line pairs (typically complementary and not specifically shown in FIG. 2) of memory array half 14 are coupled to the current mode global data lines 16 and 22, also labeled "iGDL0/iGDLB0"–"iGDL8/iGDLB8" via conventional current mode sense amplifiers. Note that a line labeled iGDL# is the normal signal and the line labeled iGDLB# is the compliment of the normal signal, thereby creating a differential signal. Note that FIG. 2 specifically shows a x36 architecture as the maximal word size whereby each of buses 16, 18, 20, and 22 provide for nine data bits.

In a x18 mode as shown in FIG. 2, each of the current mode global data line (iGDL) pairs is coupled to first terminals of the current sensing circuits 24–31. Voltage mode global data line (vGDL) pairs labeled "vGDL0/vGDLB0"–"vGDL8/vGDLB8" are coupled to second terminals of the current sensing circuits 24–31. The other ends of the voltage global data line pairs are coupled to input/output (I/O) circuits similar to input/output circuits 56–59. The voltage-mode global data lines (vGDLs) of the right side of memory 50 are coupled to input/output buffers 58 and 59 by a plurality of vertically disposed voltage mode data line pairs 52. The voltage mode global data lines of the left side of memory 50 are coupled to input/output buffers 56 and 57 by a plurality of vertically disposed voltage mode data line pairs 54. The specific layout and circuitry of the buses 52 and 54 are shown in detail in subsequent FIG. 3.

In the illustrated embodiment of FIG. 2, memory 50 is specifically configured to have a x18 word width. However, the device of FIG. 2 may be configured easily to have either a x18 word width or a x36 word width using a metal mask option. When memory 50 is configured to have a x36 word width, voltage mode global data line (vGDL) pairs 52 and 54 are not used and memory 50 functions is wired in an upper level of metal (a metal mask option) to appear very similar to the memory 10 of FIG. 1. Therefore, when in x36 mode, each of the 36 input/output buffers 35–42 (shown in FIG. 1) receive input data from a source external to the memory during a write cycle of the memory and the input/output buffer 35–42 provide output data during a read cycle of the memory. In other words, when configured in the x36 mode, the top level of metal is patterned and etched to route the iGDLs 16, 18, 20, and 22, through their respective current-to-voltage circuits 24–31, and out to thirty-six I/O circuits similar to 56–59. Therefore, in this x36 mode, the vGDL buses 52 and 54 (see FIG. 3) are totally disconnected from other portions of the memory device. In the x36 mode, the top level metal mask option fails to connect the circuits 52 and 54 since they are only needed in the x18 mode of device 50.

To cause memory 50 to operate with a x18 word width, a different metal mask option is used to couple the vertically disposed voltage-mode global data line (vGDL) pairs 52 and 54 to the current sensing circuits 24–31 as illustrated in FIG. 2. The metal mask option also couples a subset of only eighteen of the thirty-six total on-chip input/output buffers 56–59 to the vertically disposed voltage mode global data line pairs 52 and 54. In addition, tri-state buffer are wired into the circuits 24–31 so that only one of the arrays 12 or 14 are driving the eighteen output buffers 56–59 at any one point in time. In other words, the x18 mode utilizes a top level metal mask option to connect the vGDLs 52 and 54 and a subset of the I/O buffers 56–59 as shown in FIG. 2, whereas, the x36 modes uses a different mask option to wire the device as shown in FIG. 1 with all thirty-six I/O buffers 56–59 being wired and the vGDLs 52 and 54 being isolated from the device. Such a methodology and architecture allows current sensing to be used at the SRAM array level while both x36 and x18 modes may be wired without increasing current bus parasitics (R and C) beyond acceptable levels. Therefore, the device of FIG. 2 can be metal wired into one of two data width modes while maintaining current sense operation whereby the speed*power product of the device remains high regardless of which configuration is selected.

The above text discusses a methodology wherein the active circuitry to support both a x18 and x36 are made on the device but left interconnected. Once it is determined which mode is desired x18 and x36, the last level of metal is placed on the device to wire the device for one of either the x18 mode or the x36 mode. However, it is important to note that both the configurations (x18 and x36) discussed above may be hardwired simultaneously into the device at final manufacture with software programmable tri-state buffers or fuses located in the bus paths. Once both configurations are wired, a user programmable set of one or more bits or a nonvolatile permanent bit on the IC die may be set to configure the memory in one of the two modes x18 or x36. In an alternate form, fuses in the path of the two different bus configurations may be selectively blown at the same time that redundant repair operations are occurring whereby one of either the x18 or x36 modes are selected by fuses.

In x18 mode and during a read cycle of memory 50, data is read out of a selected location of memory array half 12 and/or memory array half 14. Each bit of the 18 bits of read data is provided to a data line differential pair of current mode global data line pairs 16, 18, 20 and 22. The appropriate ones of current sensing circuits 24–31, depending on whether the data is read from memory array half 12 or memory array half 14, is used to convert the bits of data from a sensed current to a differential voltage on vGDLs 52 and 54. The differential voltage is then provided to input/output buffers 56–59 by buses 52 and 54. Input/output buffers function to buffer and latch the differential data bits on the buses 52 and 54, and in the case of read cycle, convert the differential voltage to a single-ended data signal which is then provided to output terminals of the memory integrated circuit (IC).

In the case of a write cycle, the data flow is basically reversed from the data flow of a read cycle. Data to be written to memory 50 is received by input/output buffers 56–59 as a single-ended signal from a source that is external to memory 50.

Although in the illustrated embodiment a metal mask option is used to configure the word width of memory 50, one skilled in the art would recognize that memory 50 may be configured between multiple word widths using active circuitry such as programmable registers to store configuration data. Also, the illustrated embodiment only discloses configuring between two word widths. In other embodiments, more than two word widths may be used. Such may be accomplished by performing further metal optioned tri-state multiplexing and bit shifting just before the input/output buffers 56–59.

By using voltage-mode global data line (vGDL) pairs 52 and 54 to change the word width of a current sensed memory such as memory 50, the use of excessively long current mode global data line (iGDL) pairs is avoided, thus decreasing the time required to access the memory and providing reliable read data at a high speed. Therefore, the device 40 of FIG. 2 is easily configured into one of two word widths without sacrificing the advantageous speed*power product typically associated with current sensed SRAM memory.

Figure 3:
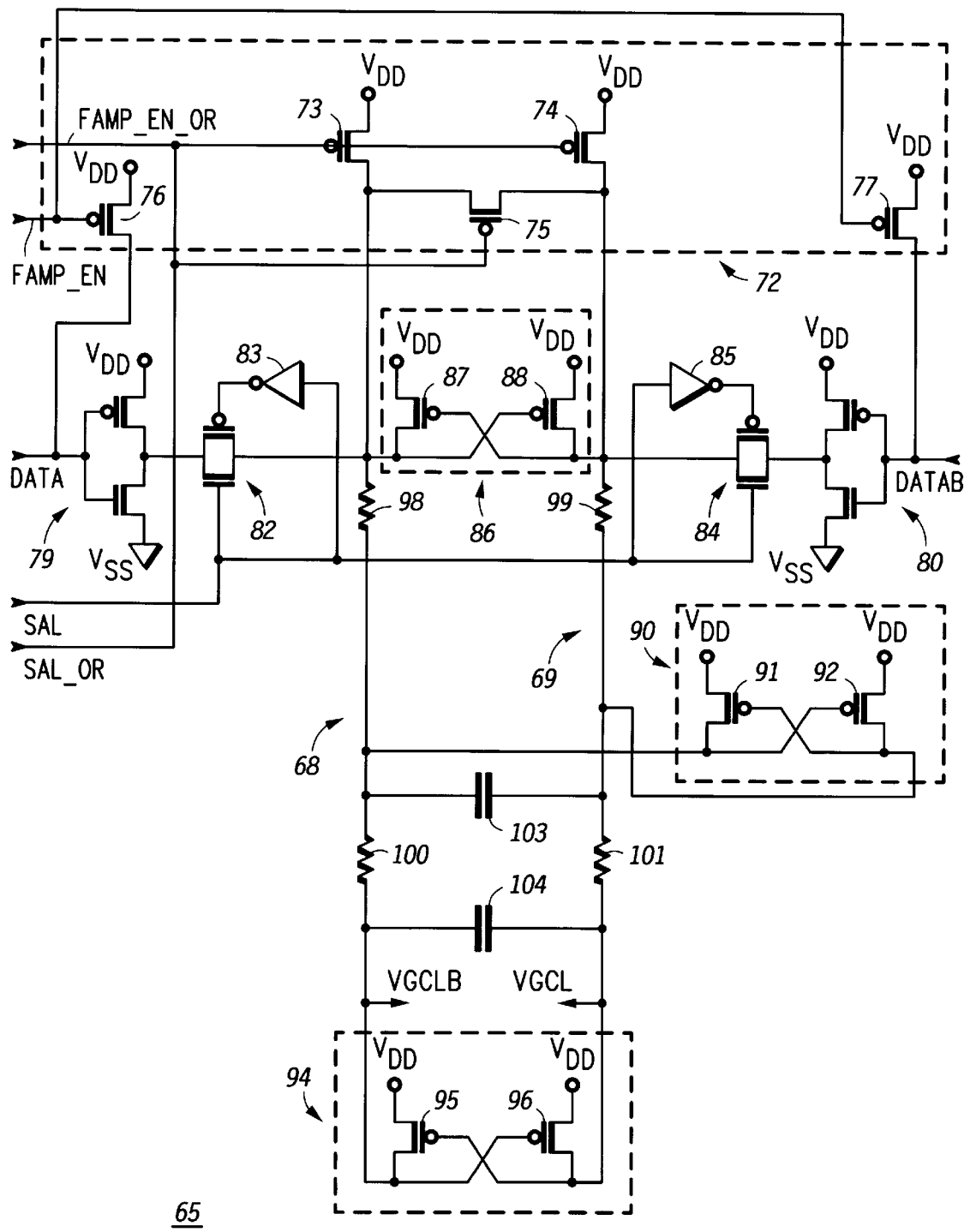
FIG. 3 illustrates, in schematic diagram form, a voltage global data line pair of the memory of FIG. 2.

FIG. 3 illustrates, in schematic diagram form, one voltage global data line (vGDL) differential pair 65 of the data line pairs 52 and 54 memory 50 of FIG. 2. Data line pair 65 includes data lines 68 and 69 (one being the complement of the other), precharge and equalization circuit 72, load circuits 86, 90, and 94, inverters 79, 80, 83, and transmission gates 82 and 84. Also shown as coupled to data lines 68 and 69 are resistors 98–101 which represent the parasitic resistance of data lines 68 and 69, and capacitors 103 and 104 which represent a coupling capacitance between data lines 68 and 69. The terminals labeled "DATA" and "DATAB" are coupled to corresponding output terminals of current sensing circuits 24–31. The terminals labeled "VGDLB" and "VGDL" are coupled to corresponding input/output buffers 56–59.

Precharge and equalization circuit 72 includes P-channel transistors 73–77. P-channel transistors 73 and 74 are coupled between the data lines and a power supply voltage labeled "VDD". In response to either a control signal labeled "FAMP_EN_OR" or a control signal labeled "SAL_OR" being asserted as a logic low, P-channel transistors 73 and 74 become conductive causing a voltage of data lines 68 and 69 to be increased to VDD or nearly VDD. P-channel transistor 75 couples data line 68 to data line 69 to equalize the voltages of data lines 68 and 69 during or in close proximity to precharge operations. P-channel transistors 76 and 77 precharge input terminals labeled "DATA" and "DATAB" in response to a control signal labeled "FAMP_EN" being asserted as a logic low. Note that a "B" after a signal name indicates that the signal is logical complement of the signal having the same name but lacking the "B".

Load circuit 86 includes P-channel transistors 87 and 88, load circuit 90 includes P-channel transistors 91 and 92, and load circuit 94 includes P-channel transistors 95 and 96. Load circuits 86, 90, and 94, which are also referred to as distributed pull-up circuits, are distributed along the length of data lines 68 and 69 and function as active loads to assist in causing a voltage difference between data lines 68 and 69 when data is being provided to data lines 68 and 69. For example, if data line 68 is being pulled low and data line 69, is being pulled high, P-channel transistor 88 of load circuit 86 will become conductive, causing data line 69 to be pulled high more quickly. Likewise, P-channel transistors 92 and 96, of load circuits 90 and 94, respectively, will also help increase the voltage of data line 69.

During a read cycle of memory 50 when memory 50 is configured as a x18 part, differential data from the current sensing circuits (e.g., circuit 24) is provided to input terminals of inverters 79 and 80. Inverters 79 and 80 invert the data signals and provide them to transmission gates 82 and 84. A logic high control signal labeled "SAL" (sense amplifier latch) causes the transmission gates 82 and 84 to be conductive, allowing data to be provided to the data lines 68 and 69. Note that in the illustrated embodiment, the data lines 68 and 69 and the input terminals labeled DATA and DATAB are precharged and equalized at a high voltage prior to an access of memory arrays 12 and 14 as described above via circuit 72. Load circuits 86, 90, and 94 assist in increasing a voltage differential between the data lines 68 and 69. The voltage differential is then provided to a destination external from memory 50 via a corresponding one of input/output buffers 56–59. Therefore, FIG. 3 teaches how a voltage output of the devices 24–31 of FIG. 2 may be quickly converted to output voltages in a manner that is quick, efficient, and does not affect current sensing on the buses 16–22.

Figure 4:
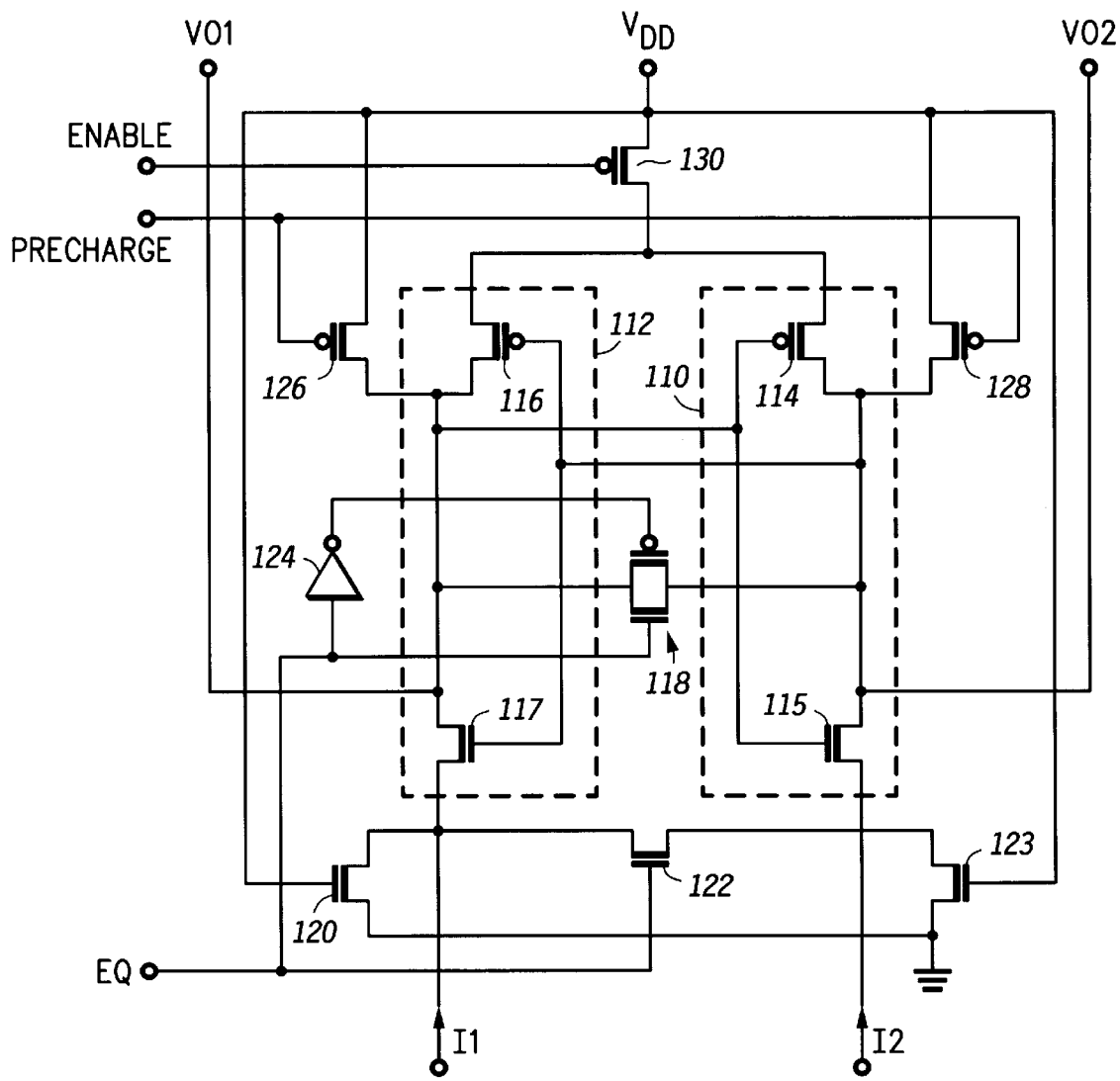
FIG. 4 illustrates, in schematic diagram form, a current sensing circuit of the memory of FIG. 2.

FIG. 4 is a schematic diagram of current sensing circuit 24 of memory 50 illustrated in FIG. 2. Each of the other current sensing circuits 25–31 are identical to current sensing circuit 24. Current sensing circuit 24 senses the difference between currents $I_1$ and $I_2$ flowing into current sensing circuit 24 through input terminals labeled I1 and I2, respectively. The difference between currents $I_1$ and $I_2$ is used for sensing the data transmitted to current sensing circuit 24. Input terminal I1 and complementary input terminal I2 are coupled to iGDL0 and iGDLB0, respectively.

Current sensing circuit 24 includes P-channel insulated gate field effect transistors (FETs) 126 and 128 which serve as current sources. The gate electrodes of FETs 126 and 128 are connected to a terminal for receiving a signal labeled "PRECHARGE". The source electrodes of FETs 126 and 128 are connected to VDD. Current sensing circuit 24 also includes a P-channel insulated gate FET 130 having a gate electrode connected to a terminal labeled "ENABLE", and a source electrode connected to VDD.

Current sensing circuit 24 further includes an inverter 112, an N-channel insulated gate FET 120, an inverter 110, and an N-channel insulated gate FET 123. Inverter 112 is comprised of a P-channel insulated gate FET 116 and an N-channel insulated gate FET 117. The gate electrodes of FETs 116 and 117 are commonly connected to form an input of inverter 112. A source electrode of FET 116 serves as a first biasing node of inverter 112 and is connected to a drain electrode of FET 130. A source electrode of FET 117 serves as a second biasing node of inverter 112 and is connected to a drain electrode of FET and to input terminal I1. The drain electrodes of FETs 116 and 117 are commonly connected to form an output of inverter 112. The output of inverter 112 is connected to a drain electrode of FET 126 and to a data output terminal labeled "VO1".

Inverter 110 is comprised of a P-channel insulated gate FET 114 and an N-channel insulated gate FET 115. The gate electrodes of FETs 114 and 115 are commonly connected to form an input of inverter 110. A source electrode of FET 114 serves as a first biasing node of inverter 110 and is connected to the drain electrode of FET 130. A source electrode of FET 115 serves as a second biasing node of inverter 110 and is connected to a drain electrode of FET 123 and to complementary input terminal I2. The drain electrodes of FETs 114 and 115 are commonly connected to form an output of inverter 110. The output of inverter 110 is connected to a drain electrode of FET 128 and to a complementary data output terminal labeled "VO2" of current sensing circuit 24.

Further, the input of inverter 112 is connected to the output of inverter 110, and the input of inverter 110 is connected to the output of inverter 112. The gate electrodes of FETs 120 and 123 are connected to $V_{DD}$. The source electrodes of FETs 120 and 123 are connected to ground (VSS).

Current sensing circuit further includes an inverter 124 and two switches, one coupled between the outputs of inverters 112 and 110, and the other coupled between the second biasing nodes of inverters 112 and 110. Preferably, the switch 118 coupled between the outputs of inverters 112 and 110 is a two transistor pass gate comprised of a P-channel insulated gate FET and an N-channel insulated gate FET. An input of inverter 124 is connected to a terminal labeled "EQ" for receiving an equalization signal. An output of inverter 124 is connected to a gate electrode of P-channel FET of switch 118. A gate electrode of the N-channel FET of switch 118 is connected to terminal EQ. The source electrodes the transistors of switch 118 are commonly connected to the drain electrodes of FETs 116 and 117. The drain electrodes of switch 118 are commonly connected to the drain electrodes of FETs 114 and 115.

Preferably, the switch coupled between the second biasing nodes of inverters 112 and 110 is a one transistor pass gate comprised of an N-channel insulated gate FET 122. A gate electrode of FET 122 is connected to EQ, a source electrode of FET 122 is connected to the source electrode of FET 117, and a drain electrode of FET 122 is connected to the source electrode of FET 115.

In operation, current sensing circuit 24 senses data by sensing a differential current signal transmitted to input terminal I1 and complementary input terminal I2. More particularly, current sensing circuit senses currents $I_1$ and $I_2$ flowing through input terminal I1 and complementary input terminal I2, respectively. Currents $I_1$ and $I_2$ are also referred to as first and second current components of the differential current signal. Current sensing circuit 24 generates two currents, one flowing in FET 117 and the other flowing in FET 115, in accordance with currents $I_1$ and $I_2$. Current sensing circuit 24 then compares the current flowing in FET 117 with the current flowing in FET 115 to sense the data.

It should be noted that the FETs of current sensing circuit 24 may be replaced with other transistor types, such as for example, bipolar transistors, metal semiconductor FETs, junction FETs, insulated gate bipolar transistors, etc. Further, FET 122 functions as a switch and can be replaced by any kind of switch. As those skilled in the art are aware, for a FET, the gate electrode serves as a control electrode, and the source and drain electrodes serve as current conducting electrodes. Because of the large voltage swing, e.g., from ground voltage level to $V_{DD}$, across output terminal VO1 and complementary output terminal VO2, the pass gate coupled therebetween is preferably a two transistor pass gate as shown in FIG. 4.

Although the invention has been described and illustrated with reference to specific embodiments, it is not intended that the invention be limited to those illustrative embodiments. Those skilled in the art will recognize that modifications and variations may be made without departing from the spirit and scope of the invention. For example, the scheme taught herein can be used to create a memory device that configurable between any plurality of modes of word sizes (e.g., 72-36-18, 32-16, 128-64-32-16, etc.). The invention taught herein may be used on any memory device, such as DRAM, SRAM, cache systems, embedded memory, ferroelectric, nonvolatile memory, EPROM, EEPROM, flash, CCDs, ferromagnetic devices, and like memory cells. While the FIG. 2 herein shows two halves of each array 12 and 14, the values may be read out one side of the memory in other architectures or may be further hierarchically segmented than that shown herein. Redundancy solutions may be used in conjunction with the techniques and apparatus taught herein. Therefore, it is intended that this invention encompass all of the variations and modifications as fall within the scope of the appended claims.

What is claimed is:

1. A memory device comprising:
   a first memory array having a first half and a second half;
   a first data bus coupled between the first half of the first memory array and a first set of current-to-voltage converters;
   a second data bus coupled between the second half of the first memory array and a second set of current-to-voltage converters; and
   a third data bus adapted to be coupled to outputs of both of the first and second sets of current-to-voltage converters when the memory device is configured to have a first data width, and wherein the third data bus is not used when the memory device is configured to have a second data width different than the first data width.

2. The memory device of claim 1 wherein the third data bus comprises:
   circuitry for precharging the third data bus to a selected precharge voltage.

3. The memory device of claim 1 wherein the third data bus communicates a state of a memory cell within the first memory array in a differential manner by providing the state of the memory cell on a first conductor and a complementary state of the memory cell on a second conductor.

4. The memory device of claim 3 wherein the third data bus comprises:
   circuitry for equalizing a voltage on the first conductor and a voltage on the second conductor prior to a read operation from the first memory array.

5. The memory device of claim 1 wherein the third data bus comprises:
   a plurality of pull-up driver circuits distributed at different distances along a length of the third data bus.

6. The memory device of claim 1 wherein the third data bus communicates differential signals on differential conductive lines for each memory cell read in the first memory array, the memory device comprising:

circuitry for precharging the differential conductive lines of the third data bus to a selected precharge voltage;

circuitry for equalizing pairs of the differential conductive lines within the third data bus during precharge operations; and a plurality of pull-up driver circuits distributed at different distances along a length of the third data bus.

7. The memory device of claim 1 further comprising:

a first set of tri-state buffers positioned between the first data bus and the third data bus.

8. The memory device of claim 7 wherein the first set of tri-state buffers ensure that only one of either the first and second data bus are functionally connected to the third data bus at any substantial period of time.

9. The memory device of claim 1 wherein the memory device is capable of being configured into one of two different memory configurations, a first memory configuration having an output word size of N and a second memory configuration having an output word size of M where M<N and N and M are finite positive integers, wherein only one of the two different memory configurations functionally utilize the third and fourth data buses.

10. The memory device of claim 9 wherein the first and second memory configurations are selected by a bit programmed by a user.

11. The memory device of claim 1 wherein the memory device is capable of being configured into one of three different memory configurations, a first memory configuration having an output word size of N, a second memory configuration having an output word size of M, and a third memory configuration having an output word size of L where L<M<N and L, M, and N are finite positive integers.

12. The memory device of claim 11 wherein the third data bus is not used when an output word size of N is selected, the third data bus is used when an output word size of M is selected, and the third data bus along with additional multiplexers are used when an output word size of L is selected.

13. The memory device of claim 1 wherein the memory device is embedded onto an integrated circuit with a data processor for processing information stored in the first memory array.

14. The memory device of claim 1 wherein the first data bus is selectively connected to the third data bus by a top level of metal formed over an integrated circuit that contains the memory device.

15. A memory device comprising:

a first memory array of memory cells;

a plurality of current amplifiers coupled to the first memory array;

a current global data bus coupled to the plurality of current amplifiers;

a plurality of current-to-voltage converters coupled to the current global data bus;

a voltage global data bus coupled to the plurality of current-to-voltage converters; and output drivers coupled to the voltage global data bus.

16. The memory device of claim 15 wherein the voltage global data bus contains circuitry for precharging and equalizing differential signal lines within the voltage global data bus.

17. The memory device of claim 15 wherein the voltage global data bus contains a plurality of pull-up circuits coupled at different distances along a length of the voltage global data bus.

18. A method for configuring a memory device, the method comprising:

providing an integrated circuit, the integrated circuit containing a memory array, the memory array being coupled to current global data bus which is coupled to current-to-voltage converters, the integrated circuit containing a voltage global data bus and output buffers that are initially disconnected from the current-to-voltage converters;

determining if the memory device is to be configured having output word sizes of xN or xM, where M<N and N and M are finite positive integers;

connecting the voltage global data bus to the current-to-voltage converters and connecting the output buffers to the voltage global data bus if a xM configuration is selected; and connecting the current-to-voltage converters to the output buffers without using the voltage global data bus if a xN configuration is selected.

19. The method of claim 18 wherein the steps of connecting are performed by choosing one of two top level metal masks during manufacture of the integrated circuit to create a top level of metal on the integrated circuit in a proper configuration.

20. The method of claim 18 wherein the steps of connecting are performed by programming a bit location within the integrated circuit to select one of either the xN configuration or the xM configuration.

21. The method of claim 18 wherein M=18 and N=36.

* * * * *